United States Patent
Bradford et al.

(10) Patent No.: US 8,083,947 B2
(45) Date of Patent: Dec. 27, 2011

(54) POLYMER-CONTAINING SOLVENT PURIFYING PROCESS

(75) Inventors: David C. Bradford, Winston-Salem, NC (US); M. Zaki Ali, Mendota Heights, MN (US)

(73) Assignee: Eastman Kodak Company, Rochester, NY (US)

( * ) Notice: Subject to any disclaimer, the term of this patent is extended or adjusted under 35 U.S.C. 154(b) by 216 days.

(21) Appl. No.: 12/391,344

(22) Filed: Feb. 24, 2009

(65) Prior Publication Data
US 2010/0213128 A1 Aug. 26, 2010

(51) Int. Cl.
*B01D 61/00* (2006.01)
*C02F 1/42* (2006.01)

(52) U.S. Cl. ........ 210/651; 210/650; 210/638; 210/749; 430/284.1

(58) Field of Classification Search ................... 210/650, 210/651, 638–639, 749; 430/306, 294, 286.1, 430/7, 284.1
See application file for complete search history.

(56) References Cited

U.S. PATENT DOCUMENTS

| | | | |
|---|---|---|---|
| 4,776,999 A * | 10/1988 | Kohn | 264/41 |
| 5,041,227 A | 8/1991 | van Eikeren et al. | |
| 5,240,815 A | 8/1993 | Telser et al. | |
| 5,322,761 A * | 6/1994 | Kausch et al. | 430/273.1 |
| 5,354,645 A | 10/1994 | Schober et al. | |
| 5,605,633 A * | 2/1997 | Nakamura et al. | 210/732 |
| 5,734,944 A * | 3/1998 | Seeley et al. | 396/565 |
| 6,074,561 A * | 6/2000 | Jablonsky | 210/650 |
| 6,180,009 B1 | 1/2001 | Gottwald | |
| 6,247,856 B1 * | 6/2001 | Shibano et al. | 396/565 |
| 6,485,650 B1 * | 11/2002 | Bhown | 210/643 |
| 6,582,886 B1 | 6/2003 | Hendrickson et al. | |
| 6,584,832 B2 * | 7/2003 | Petro et al. | 506/12 |
| 6,897,008 B1 | 5/2005 | Hendrickson et al. | |
| 7,235,346 B2 | 6/2007 | Knoll et al. | |
| 7,297,277 B2 | 11/2007 | Radomyselski et al. | |
| 7,326,353 B2 | 2/2008 | Hendrickson et al. | |
| 7,368,148 B2 * | 5/2008 | Nakamura et al. | 427/162 |
| 7,702,992 B2 * | 4/2010 | Ogawa | 714/798 |
| 2010/0213128 A1 * | 8/2010 | Bradford et al. | 210/650 |

FOREIGN PATENT DOCUMENTS

| | | |
|---|---|---|
| EP | 0 430 233 A2 | 6/1991 |
| EP | 0 933 684 A1 | 8/1999 |
| WO | WO 97/03382 A1 | 1/1997 |

OTHER PUBLICATIONS

Biotech & Pharmaceutical Processes; KMS Membranes: Cost effectively Separating, Purifying and concentrating Pharmaceuticals and their intermedia, pp. 1-2, 2004-2008; Kochmembrane.com/biotechp. html.*
Scepter Stainless Steel Membrane, Graver Technologies, GTX-182-rev, (Mar. 2007).

* cited by examiner

*Primary Examiner* — Ana Fortuna
(74) *Attorney, Agent, or Firm* — J. Lanny Tucker

(57) ABSTRACT

Polymer-containing solution can be purified and the solvent reused by subjecting the solution to microfiltration using tubular filters having an average pore diameter of less than 1 μm and a filtration pressure of at least 0.35 MPa. This method is particularly useful for reclaiming and reusing solvents that are used in the development or chemical washout of flexographic printing plates.

15 Claims, 1 Drawing Sheet

POLYMER-CONTAINING SOLVENT PURIFYING PROCESS

FIELD OF THE INVENTION

This invention relates to a method for purifying and optionally reusing (or recycling) polymer-containing solutions, such as those used in the production of flexographic printing plates. More specifically, this method relates to purifying such solutions using microfiltration as the primary purification means.

BACKGROUND OF THE INVENTION

Organic solutions are used in various industries for washing, developing, or cleaning various substrates or materials and as a result, the organic solutions generally become contaminated with various polymeric materials that are dissolved in the organic solvents of which the organic solutions are composed.

For example, washout or developing processes are known for the preparation of flexographic printing plates, and the developing solutions become contaminated with various polymeric and non-polymeric materials from the non-imaged portions of the flexographic printing plate precursors. Such developing processes are described for example in U.S. Pat. No. 5,240,815 (Telser et al.), U.S. Pat. No. 7,226,709 (Kidnie et al.), and U.S. Pat. No. 7,279,254 (Zwadlo) and in U.S. Patent Application Publication 2005/0227182 (Ali et al.). Generally, the flexographic printing plate precursors are imaged and then developed to remove non-polymerized material while leaving the polymerized (cured) material intact to form a relief image in the resulting flexographic printing plates. Various organic solvents are generally contained in such developing solution including but not limited to, chlorinated hydrocarbons, saturated cyclic or acyclic hydrocarbons, aromatic hydrocarbons, lower aliphatic ketones, and terpene hydrocarbons.

Because flexographic printing plate precursors can be prepared from a variety of polymeric materials, it is usually necessary to match the imaged precursors with specific developing solutions so the non-polymerized materials can be quickly and completely removed to provide the relief images. Mechanical means such as brushing with rubbing means may be used to facilitate polymer removal.

The need for different developing solutions is a major inconvenience in the industry of flexography, particularly if all types of flexographic printing plate precursors are being imaged and processed in the same facility. The industry has been trying to develop effective and environmentally-friendly developing solutions to overcome these problems. For example, U.S. Pat. No. 6,248,502 (Eklund) describes the use of terpene esters in developing solutions to overcome some of these problems.

In addition, U.S. Pat. No. 7,326,353 (Hendrickson et al.) describes a useful process for purifying or recycling developing solutions containing specific organic solvents. This process requires the use of centrifuging the polymer-containing solvents with optional organic membrane filtration steps before or after centrifugation.

SUMMARY OF THE INVENTION

The present invention provides an improved method for purification, reclaiming, or recycling organic solvents from various industrial processes but particularly from the development of imaged flexographic printing plate precursors.

Thus, this invention provides a method for purifying a polymer-containing solution consisting essentially of subjecting the polymer-containing solution to microfiltration using a tubular filter having an average pore diameter of less than 1 μm and a filtration pressure of at least 0.35 MPa to provide a purified solution.

More specifically, the present invention provides a method for purifying a polymer-containing flexographic developing solution comprising:

subjecting the developing solution to microfiltration using a metal tubular filter having an average pore diameter of from about 0.02 to about 0.5 μm and a filtration pressure from about 1 to about 2 MPa and a flow rate of from about 15 to about 1,000 liters/min to provide a purified developing solution, the developing solution containing one or more block copolymers of styrene and butadiene, block copolymers of styrene and isoprene, copolymers of butadiene and acrylonitrile, or copolymers of butadiene, acrylonitrile and acrylic acid.

We have found that the method of this invention is an environmentally freed, simple, and inexpensive means for reclaiming or recycling organic solvents such as flexographic developing solvents. While known reclamation methods are suitable for removing particulates and relatively large materials, the present invention can be used to remove smaller materials because of the use of microfiltration tubes having average pore size below 1 μm. Distillation and other power consuming and expensive methods can be avoided. The reclaimed solvents can be reused if desired or discarded in an environmentally appropriate manner.

DETAILED DESCRIPTION OF THE INVENTION

Figure 1:
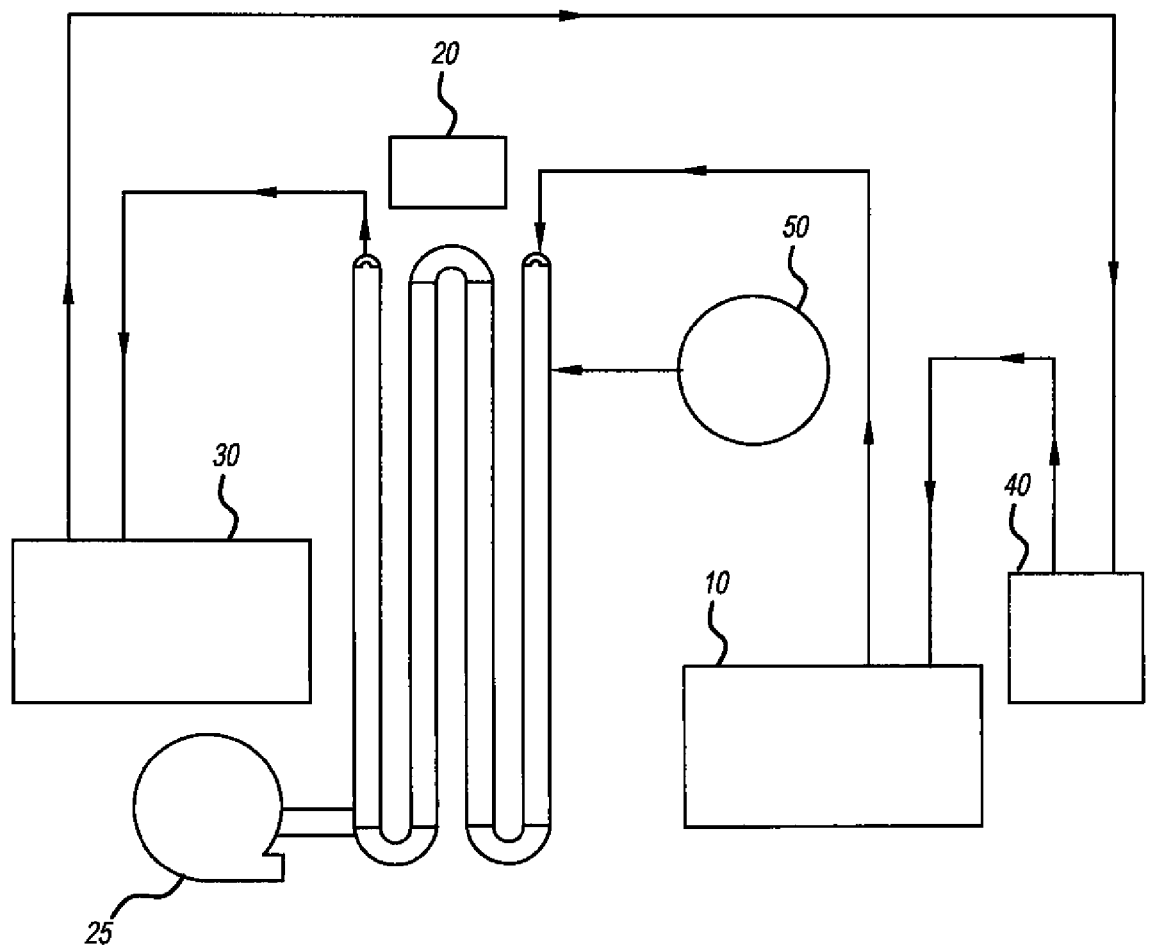
FIG. 1 is a schematic diagram of one embodiment of this invention.

The method can be carried out in a self-contained apparatus or by using separate equipment in different places. Most advantageously, the method is carried out in a self-contained manner so that the purified solvent can be readily recycled for reuse, for example, in a continuous manner. One system useful for this purpose is known as the Cold Reclamation System (CRS) that includes a continuous, tubular microfiltration process utilizing for example, stainless steel tubular filters. The method can also be carried out in a batch manner.

The method of this invention can be illustrated by reference to FIG. 1 and the details provided below. Polymer-containing solution can be taken from "seasoned" holding tank 10 through microfiltration tubes 20 using one or more pumps (for example, pump 25) into purified solution holding tank 30. The purified solution can be recycled, for example, to flexographic printing plate processing equipment 40, thus making a fill cycle. Unused "fresh" solution can also be added from replenishment tank 50.

The various parts of the purification system illustrated in FIG. 1 can be obtained from various commercial sources. For example, very useful microfiltration tubes generally have a pore diameter less than 1 μm, and more likely from about 0.02 to about 0.5 μm. Commercial examples of useful stainless steel tubular filter membranes are commercially available from Graver Technologies (Glasgow, Del.) as SCEPTER stainless steel tubular filter members. One such product is a $TiO_2$-sintered membrane on a stainless steel support having an average pore diameter of about 0.1 μm.

The polymer-containing solution can be pumped through the tubular filters at a pressure of at least 0.35 megapascals (MPa) (or 50 psi) and generally at from about 1 to about 2 MPa as a flow rate of from about 15 to about 1,000 liters/min (for example, about 15 to 50 liters/min going into the microfiltration tubes and up to 1,000 liters/min inside the microfiltration tubes). The permeate is pushed through the microfilter tubular membranes for recirculation or storage for future use. Recycling allows for continuous processing, for example, of imaged flexographic printing plate precursors. Concentrate that may build up within the microfiltration tubes, and containing polymers and other undesired materials, can be disposed of in any suitable manner. The microfiltration process generally recirculates the polymer-containing solution as many times as needed to reduce the solid content to 3% or less and preferably to 1% or less.

The method of this invention can be carried out at a temperature of from about 15 to about 50° C.

The polymer-containing solution is a polymer-containing organic solution such as a flexographic printing plate developing solution. The solution may contains one or more block copolymers of styrene and butadiene, block copolymers of styrene and isoprene, copolymers of butadiene and acrylonitrile, and copolymers of butadiene, acrylonitrile, and acrylic acid.

Moreover, the polymer-containing solution generally contains one or more of the following organic compounds: dialkylene glycol dialkyl ethers, acetic acid esters, carboxylic acid esters, alcohols, terpenes, terpene esters, lower aliphatic ketones, aromatic hydrocarbons, saturated or alicyclic hydrocarbons, and chlorinated hydrocarbons, that can serve as solvents or solvent mixtures.

While the microfiltration technique described herein is the only essential purification technique for this invention, the present invention may optionally include prefiltering the flexographic developing solution to remove solids before the microfiltration. Alternatively, or in addition to prefiltration, the method may also include, after microfiltration, subjecting the purified developing solution to ultrafiltration to remove non-polymeric molecules such as photoinitiators, crosslinking agents (or thermal curing agents), colorants, and any other additives that may be present in flexographic imaging compositions.

To aid in the separation and filtration of polymers from solvents in the polymer-containing solution (such as flexographic developers or washout solutions), the contaminated solution may be pre-treated before the microfiltration step in a crosslinking step to crosslink polymers and photopolymerizable monomers and oligomers. The crosslinking may be achieved using any suitable process such as UV or visible irradiation with thermal curing agents, such as peroxides, or the use of a flocculation step using a flocculating agent that is appropriate for the given polymer(s) in the solution. The crosslinking and flocculation steps can be used simultaneously or in sequence if desired.

The following example is meant to be representative of how the present invention is carried out and is not meant to be limiting in any manner.

Example

Samples of commercially available Cyrel® flexographic printing plate precursors (DuPont) were imagewise exposed and then processed (developed) in a commercially available flexographic plate processor unit using a washout solution (developer) like that described in Example 4 of U.S. Pat. No. 6,162,593 (Wyatt et al.) that contained diisopropylbenzene, benzyl alcohol, a petroleum distillate, and a terpene alcohol. The resulting contaminated flexographic developing solution, which contained dissolved polymer from the flexographic printing plate, was then pumped through a SCEPTER stainless steel membrane module (containing $TiO_2$ coatings permanently sintered to the inside of stainless steel support tubes). When the polymer level in the permeate (purified solvent solution) reached about 3 weight % solids (typically 1% solids or less), the purified solvent solution was ready for reuse in the plate processor unit and supplied to that unit as needed to process additional imaged plate samples.

The invention has been described in detail with particular reference to certain preferred embodiments thereof, but it will be understood that variations and modifications can be effected within the spirit and scope of the invention.

The invention claimed is:

1. A method for purifying a polymer-containing organic solvent solution that is a flexographic printing plate organic solvent developing solution, the method consisting essentially of subjecting said polymer-containing organic solvent solution to microfiltration using a tubular filter having an average pore diameter of less than 1 μM and a filtration pressure of at least 0.35 MPa.

2. The method of claim 1 wherein said tubular filter has an average pore diameter of from about 0.02 to about 0.5 μm.

3. The method of claim 1 wherein said polymer-containing organic solvent solution contains one or more block copolymers of styrene and butadiene, block copolymers of styrene and isoprene, copolymers of butadiene and acrylonitrile, and copolymers of butadiene, acrylonitrile and acrylic acid.

4. The method of claim 1 wherein said microfiltration reduces the solid content of said polymer-containing organic solvent solution to 1% or less.

5. The method of claim 1 wherein said microfiltration is carried out at a flow rate of from about 15 to about 1,000 liters/min.

6. The method of claim 1 that is a continuous process.

7. The method of claim 1 that is a batch process.

8. The method of claim 1 wherein said polymer-containing organic solvent solution contains one or more of the following organic compounds: dialkylene glycol dialkyl ethers, acetic acid esters, carboxylic acid esters, alcohols, terpenes, terpene esters, lower aliphatic ketones, aromatic hydrocarbons, saturated or alicyclic hydrocarbons, and chlorinated hydrocarbons, as an organic solvent or organic solvent mixture.

9. The method of claim 1 that is carried out at a temperature of from about 15 to about 50° C.

10. A method for purifying a polymer-containing flexographic organic solvent developing solution comprising:
    subjecting said organic solvent developing solution to microfiltration using a metal tubular filter having an average pore diameter of from about 0.02 to about 0.5 μm and a filtration pressure from about 1 to about 2 MPa and a flow rate of from about 15 to about 1,000 liters/min to provide a purified organic solvent developing solution,
    said organic solvent developing solution containing one or more block copolymers of styrene and butadiene, block copolymers of styrene and isoprene, copolymers of butadiene and acrylonitrile, or copolymers of butadiene, acrylonitrile and acrylic acid.

11. The method of claim 10 wherein said purified organic solvent developing solution is reused to process imaged flexographic printing plate precursors.

12. The method of claim 10 further comprising, before microfiltration, prefiltering said flexographic organic solvent developing solution to remove solids.

13. The method of claim 10 further comprising, after microfiltration, subjecting said purified organic solvent developing solution to ultrafiltration to remove non-polymeric molecules.

14. The method of claim 10 wherein said metal tubular filter is a stainless steel tubular filter membrane.

15. The method of claim 10 wherein prior to subjecting said polymer-containing flexographic organic solvent developing solution to microfiltration, said polymer-containing flexographic organic solvent developing solution was subjected to a crosslinking step or a flocculation step.

* * * * *